United States Patent
Nahum et al.

(10) Patent No.: US 10,592,370 B2
(45) Date of Patent: Mar. 17, 2020

(54) USER CONTROL OF AUTOMATED TEST FEATURES WITH SOFTWARE APPLICATION PROGRAMMING INTERFACE (API)

(71) Applicant: Advantest Corporation, Tokyo (JP)

(72) Inventors: Rotem Nahum, San Jose, CA (US); Padmaja Nalluri, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 164 days.

(21) Appl. No.: 15/582,285

(22) Filed: Apr. 28, 2017

(65) Prior Publication Data
US 2018/0314613 A1    Nov. 1, 2018

(51) Int. Cl.
G06F 11/00    (2006.01)
G06F 11/273    (2006.01)
G11C 29/56    (2006.01)

(52) U.S. Cl.
CPC ............ *G06F 11/273* (2013.01); *G11C 29/56* (2013.01)

(58) Field of Classification Search
CPC .. G06F 11/273; G11C 29/56; G11C 29/56016
See application file for complete search history.

(56) References Cited

U.S. PATENT DOCUMENTS

| | | | |
|---|---|---|---|
| 7,852,094 B2 | 12/2010 | Chraft et al. | |
| 8,078,424 B2 | 12/2011 | Adachi | |
| 9,203,617 B2 * | 12/2015 | Ducharme | H04L 9/083 |
| 9,810,729 B2 * | 11/2017 | Frediani | G01R 31/31907 |
| 2005/0223232 A1 * | 10/2005 | Anderson | G01R 31/31719 713/184 |
| 2005/0235263 A1 * | 10/2005 | Bundy | G06F 11/263 717/124 |
| 2011/0000829 A1 * | 1/2011 | Linde | B07C 5/344 209/571 |
| 2011/0078525 A1 | 3/2011 | Xia et al. | |
| 2011/0099424 A1 * | 4/2011 | Rivera Trevino | G06F 11/263 714/25 |
| 2011/0288808 A1 * | 11/2011 | Fan | G01R 31/2894 702/118 |
| 2012/0197582 A1 | 8/2012 | Richardson | |
| 2013/0212207 A1 * | 8/2013 | Ong | G06F 15/167 709/213 |

(Continued)

OTHER PUBLICATIONS

Webopedia, API—Application Program Interface (Year: 2019).*

*Primary Examiner* — Marc Duncan
*Assistant Examiner* — Jonathan D Gibson

(57) ABSTRACT

A system for performing an automated test is disclosed. The method comprises programming a application programming interface (API) to control a default production flow on a tester, wherein the production flow comprises a plurality of test sequences associated with executing tests on devices under test (DUTs) connected to the tester. The method further comprises configuring the API to modify the default production flow to customize the plurality of test sequences in accordance with a user-specific API, wherein the user-specific API comprises a modification to the production flow in accordance with testing requirements of a user. Finally, the method comprises integrating the user-specific API with the API to customize the API for the user.

13 Claims, 9 Drawing Sheets

(56) References Cited

U.S. PATENT DOCUMENTS

| | | | |
|---|---|---|---|
| 2014/0215439 A1* | 7/2014 | Krishnan | G06F 11/3688 717/124 |
| 2014/0236524 A1* | 8/2014 | Frediani | G01R 31/2834 702/108 |
| 2014/0244204 A1* | 8/2014 | Frediani | G01R 31/31907 702/119 |
| 2014/0258778 A1* | 9/2014 | Kimm | G06F 11/2294 714/25 |
| 2015/0074653 A1* | 3/2015 | Eracar | G01R 31/31908 717/129 |
| 2015/0177316 A1* | 6/2015 | Buras | G01R 31/2834 702/117 |
| 2015/0293174 A1* | 10/2015 | Ge | G01R 31/31907 714/726 |
| 2019/0033373 A1* | 1/2019 | Frank | G01R 31/31713 |

* cited by examiner

USER CONTROL OF AUTOMATED TEST FEATURES WITH SOFTWARE APPLICATION PROGRAMMING INTERFACE (API)

CROSS-REFERENCE TO RELATED APPLICATIONS

Related Applications

The present application is related to U.S. patent application Ser. No. 15/582,316, filed Apr. 28, 2017, entitled "TEST SYSTEM SUPPORTING MULTIPLE USERS USING DIFFERENT APPLICATIONS," naming Rotem Nahum, Rebecca Toy, Padmaja Nalluri, and Leon Chen as inventors. That application is incorporated herein by reference in its entirety and for all purposes.

FIELD OF THE INVENTION

The present disclosure relates generally to the field of automated test equipment and more specifically to techniques of controlling such equipment.

BACKGROUND OF THE INVENTION

Automated test equipment (ATE) can be any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure.

It is common for an ATE system to include a computer that directs the operation of the ATE system. Typically, the computer runs one or more specialized software programs to provide (i) a test development environment and (ii) a device testing environment. In the test development environment, a user typically creates a test program, e.g., a software-based construct of one or more files that controls various portions of the ATE system. In the device testing environment, the user typically provides the ATE system with one or more devices for testing, and directs the ATE system to test each device in accordance with the test program. The user can test additional devices by simply providing the additional devices to the ATE system, and directing the ATE system to test the additional devices in accordance with the test program. Accordingly, the ATE system enables the user to test many devices in a consistent and automated manner based on the test program.

In a typical prior art testing environment, the test development environment may comprise an application programming interface (API) that controls many of the high level functionalities and features of the tester. The API interfaces with a control server for directing high level functionality and features of the testing platform. One typical issue with such an API is that in order to customize the testing system for a given application or a given customer, the API must be manually altered and reprogrammed. This can be a difficult, long, costly, complex and error prone process involving highly trained and specialized professionals. It would be advantageous to provide an easier, faster, more automatic and streamlined way to customize the functionality and features of the API for a particular customer's needs.

BRIEF SUMMARY OF THE INVENTION

Accordingly, a need exists for a test development environment that can easily be adapted for different customers of the test system. Further, what is needed is a test development environment with an application programming interface that can easily be customized to suit the requirements of different customers of the ATE system. Using the beneficial aspects of the systems described, without their respective limitations, embodiments of the present invention provide a novel solution to address these problems.

The invention disclosed herein utilizes a plurality of primitives (or tester slices) and associated DUT interface boards (DIBs) to test the DUTs. Each primitive is modular meaning that it is capable of operating independently from other primitives. Therefore, a plurality of primitives set in a rack can each be operating under a different test plan. The primitives communicate with a control server for instructions, control, management, etc. The control server is capable of hosting multiple application programs or test plans for the various primitives it supports. The primitive can communicate with the server via a standard IP network. Various computer systems, which can be located remotely, can access the server via standard IP network connections.

Therefore, under this testing platform, due to: 1) primitive modularity; and 2) use of standard IP network, it is possible for a plurality of primitives to be testing a plurality of DUTs under a given test plan in accordance with one user while a second plurality of primitives of the same rack are performing a completely different application directed by a second user, and so on. Therefore, the problems heretofore associated with idle test circuitry of the prior art are eliminated.

An application programming interface (API) controls the high level functionality and features of the tester system and communicates with the primitives through the server. The API called the Custom Integrated Manufacturing Process (CIM) controls many high level functions and features of the test system with respect to 1) which test plans are used, 2) the manner in which the user interfaces look and operate with the tester via the user station, 3) processing when new DUTs are inserted for testing and controlling the subsequent process 4) the manner in which the test results of the testing are gathered and stored, etc.

In accordance with aspects of the present invention, the user can store user code and use APIs within a library associated with the tester system. The user code can be customer developed based on information and syntax provided by the CIM developer and then loaded into the library.

The CIM then integrates the user code and user APIs so that the integrated CIM automatically becomes customized to a particular customer's needs and adopts specific functionality and features in accordance with the contents of the user library. In this way, embodiments of the present invention effectively provide an automatic mechanism for customizing the CIM which obviates the need for the CIM to be manually rewritten and redesigned for each customer's needs. This increases the turn around time for developing a new CIM, and also decreases the overall software costs and errors caused by CIM modifications.

In one embodiment, a method for performing tests using automated test equipment (ATE) is presented. The method comprises programming an application programming interface (API) to control a default production flow on a tester, wherein the production flow comprises a plurality of test sequences associated with executing tests on devices under test (DUTs) connected to the tester. The method further comprises configuring the API to modify the default production flow to customize the plurality of test sequences in accordance with a user-specific API, wherein the user-specific API comprises a modification to the production flow in accordance with testing requirements of a user. Finally, the method comprises integrating the user-specific API with the API to customize the API for the user.

In another embodiment, a non-transitory computer-readable medium having computer-readable program code embodied therein for causing a computer system to perform a method for performing tests using automated test equipment (ATE) is disclosed. The method comprises programming an application programming interface (API) to control a default production flow on a tester, wherein the production flow comprises a plurality of test sequences associated with executing tests on devices under test (DUTs) connected to the tester. The method further comprises configuring the API to modify the default production flow to customize the plurality of test sequences in accordance with a user-specific API, wherein the user-specific API comprises a modification to the production flow in accordance with testing requirements of a user. Finally, the method comprises integrating the user-specific API with the API to customize the API for the user.

In a different embodiment, a system for performing tests using automated test equipment (ATE) is disclosed. The system comprises a server communicatively coupled to a plurality of primitives, wherein each of the plurality of primitives comprises a plurality of DUTs. The system also comprises a first computing device running a graphical user interface (GUI), wherein the computing device is communicatively coupled to the server, and wherein the graphical user interface allows a user to access the plurality of primitives, and a second computing device communicatively coupled with the server and the first computing device. The second computing device is configured to: (a) program an application programming interface (API) to control a default production flow, wherein the production flow comprises a plurality of test sequences associated with executing tests the DUTs connected to the server; (b) configure the API to modify the default production flow to customize the plurality of test sequences in accordance with a user-specific API, wherein the user-specific API comprises a modification to the production flow in accordance with testing requirements of a user; and (c) integrate the user-specific API with the API to customize the API for the user.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1A:
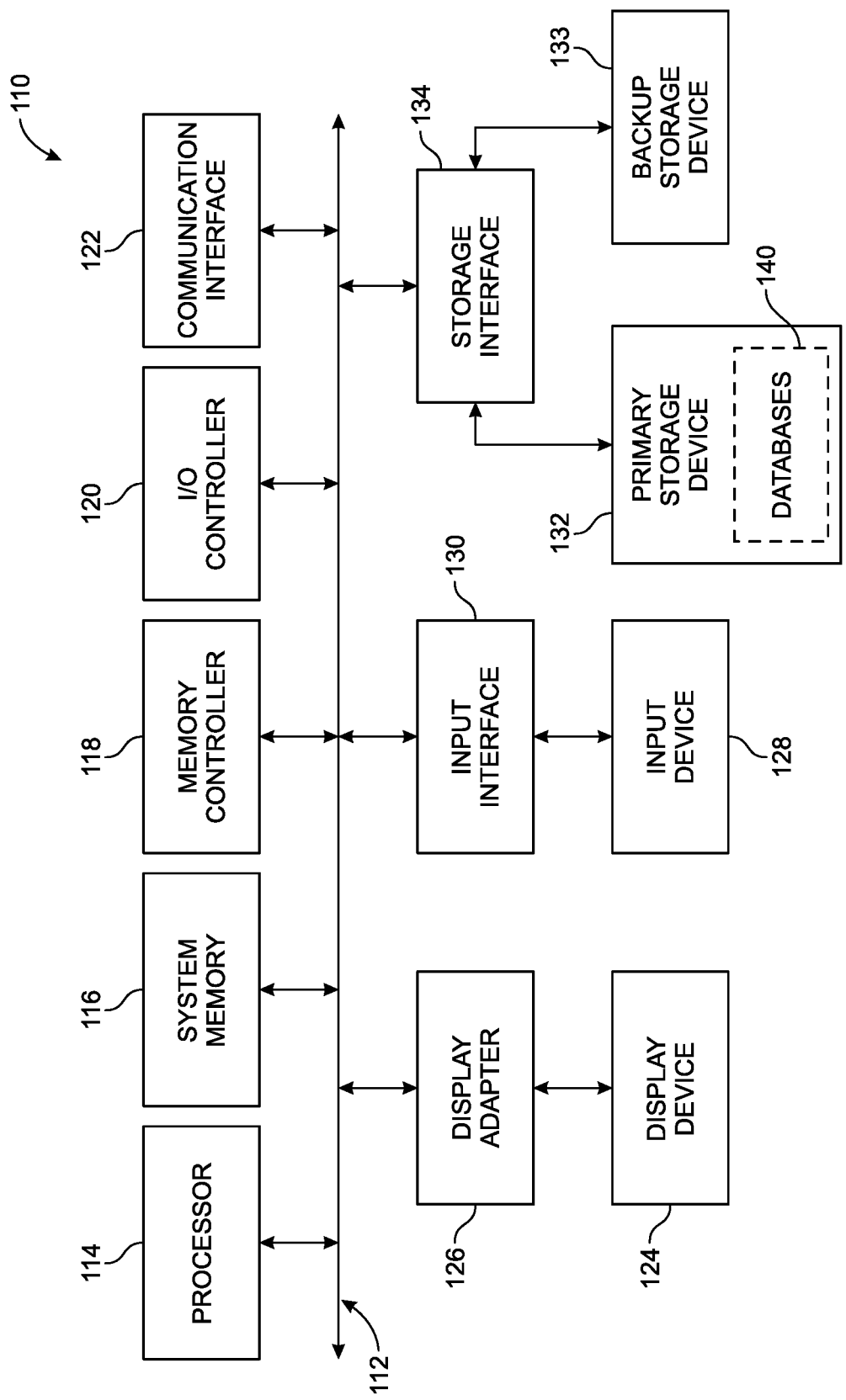
FIG. 1A is a computer system on which embodiments of the automated test system of the present invention can be implemented in accordance with one embodiment of the present invention.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "configuring," "programming," "integration," "providing," "executing," or the like, refer to actions and processes (e.g., flowchart 700 of FIG. 7) of a computer system or similar electronic computing device or processor (e.g., system 110 of FIG. 1A). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1A is a block diagram of an example of a tester control system 110 operable to be controlled by an application programming interface (API) that is customizable to serve a client's testing requirements in accordance with embodiments of the present invention. For example, the API controlling system 110 may be customized to read particular data from a device under test (DUT) during testing that is not read in the default API. Tester control system 110 broadly represents any single or multi-processor computing device or system capable of executing computer-readable instructions. Examples of control system 110 include, without limitation, workstations, laptops, client-side terminals, servers, distributed computing systems, handheld devices, or any other computing system or device. In its most basic configuration, control system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments control system 110 may include both a volatile memory unit (such as, for example, system memory 116) and a non-volatile storage device (such as, for example, primary storage device 132).

Tester control system 110 may also include one or more components or elements in addition to processor 114 and system memory 116. For example, in the embodiment of FIG. 2A, control system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of control system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of control system 110, such as processor 114, system memory 116, communication interface 122, display adapter 126, input interface 130, and storage interface 134.

Communication interface 122 broadly represents any type or form of communication device or adapter capable of facilitating communication between example control system 110 and one or more additional devices. For example, communication interface 122 may facilitate communication between control system 110 and a private or public network including additional control systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between control system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow control system 110 to engage in distributed or remote computing. For example, communication interface 122 may receive instructions from a remote device or send instructions to a remote device for execution.

As illustrated in FIG. 1A, control system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1A, control system 110 may also include at least one input device 128 coupled to communication infrastructure 112 via an input interface 130. Input device 128 generally represents any type or form of input device capable of providing input, either computer- or human-generated, to control system 110. Examples of input device 128 include, without limitation, a keyboard, a pointing device, a speech recognition device, or any other input device.

As illustrated in FIG. 1A, control system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of control system 110.

In one example, databases 140 may be stored in primary storage device 132. Databases 140 may represent portions of a single database or computing device or it may represent multiple databases or computing devices. For example, databases 140 may represent (be stored on) a portion of control system 110 and/or portions of example network architecture 200 in FIG. 2 (below). Alternatively, databases 140 may represent (be stored on) one or more physically separate devices capable of being accessed by a computing device, such as control system 110 and/or portions of network architecture 200.

Continuing with reference to FIG. 1A, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into control system 110. For example, storage devices 132 and 133 may be configured to read and write software, data, or other computer-readable information. Storage devices 132 and 133 may also be a part of control system 110 or may be separate devices accessed through other interface systems.

Many other devices or subsystems may be connected to control system 110. Conversely, all of the components and devices illustrated in FIG. 1A need not be present to practice the embodiments described herein. The devices and subsystems referenced above may also be interconnected in different ways from that shown in FIG. 1A. Control system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into control system 110. All or a portion of the computer program stored on the computer-readable medium may then be stored in system memory 116 and/or various portions of storage devices 132 and 133. When executed by processor 114, a computer program loaded into control system 110 may cause processor 114 to perform and/or be a means for performing the functions of the example embodiments described and/or illustrated herein. Additionally or alternatively, the example embodiments described and/or illustrated herein may be implemented in firmware and/or hardware.

Figure 1B:
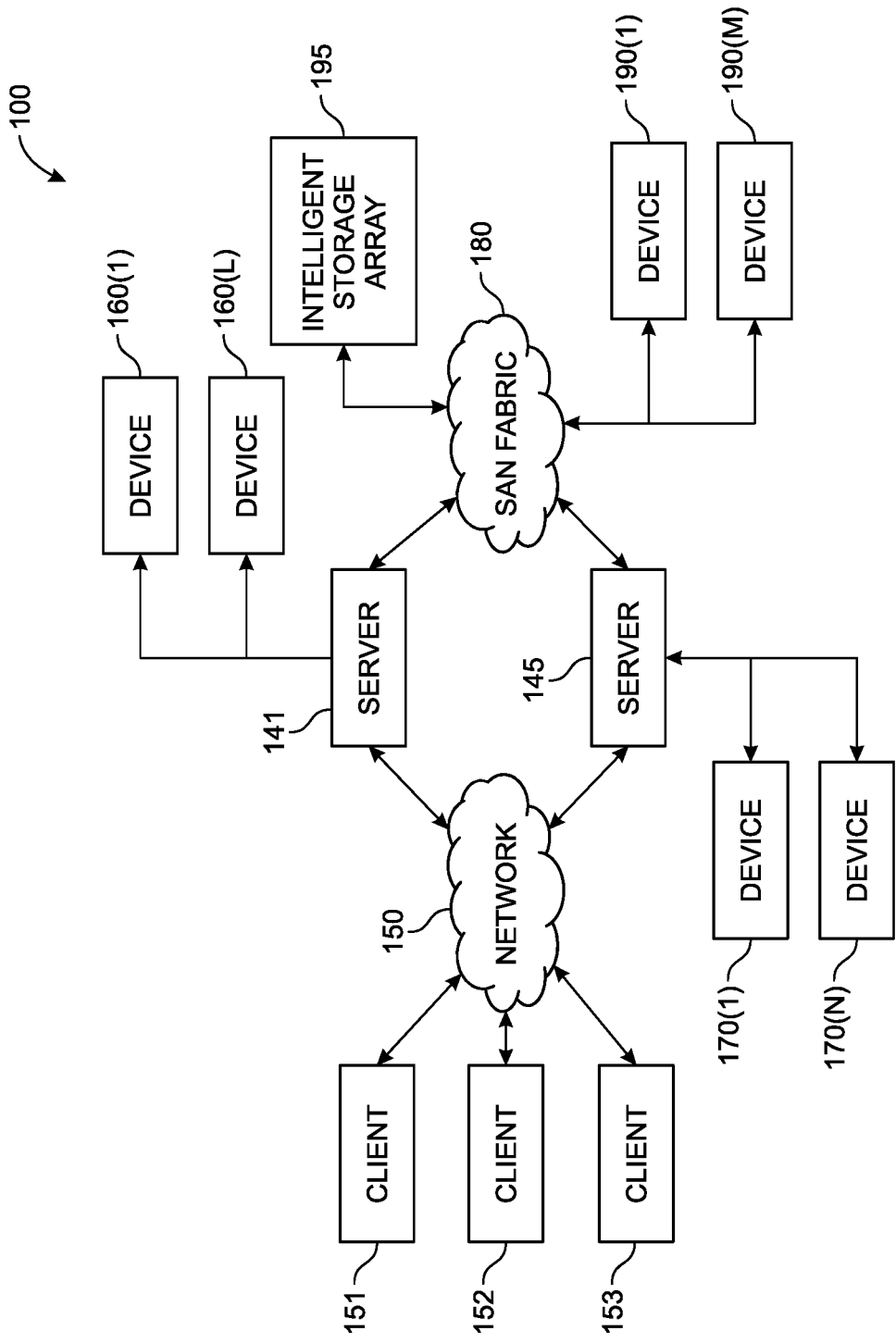
FIG. 1B is a block diagram of an example of a network architecture in which client systems and servers may be coupled to a network, according to embodiments of the present invention.

FIG. 1B is a block diagram of an example of a network architecture 100 in which client systems 151, 152 and 153 and servers 141 and 145 may be coupled to a network 150. Client systems 151, 152 and 153 generally represent any type or form of computing device or system, such as tester control system 110 of FIG. 1A.

Similarly, servers 141 and 145 generally represent computing devices or systems, such as application servers or database servers, configured to provide various database services and/or run certain software applications. Network 150 generally represents any telecommunication or computer network including, for example, an intranet, a wide area network (WAN), a local area network (LAN), a personal area network (PAN), or the Internet.

With reference to control system 100 of FIG. 1B, a communication interface, such as communication interface 122, may be used to provide connectivity between each client system 151, 152 and 153 and network 150. Client systems 151, 152 and 153 may be able to access information on server 141 or 145 using, for example, a Web browser or other client software. Such software may allow client systems 151, 152 and 153 to access data hosted by server 140, server 145, storage devices 160(1)-(L), storage devices 170(1)-(N), storage devices 190(1)-(M), or intelligent storage array 195. Although FIG. 1B depicts the use of a network (such as the Internet) for exchanging data, the embodiments described herein are not limited to the Internet or any particular network-based environment.

In one embodiment, all or a portion of one or more of the example embodiments disclosed herein are encoded as a computer program and loaded onto and executed by server 141, server 145, storage devices 160(1)-(L), storage devices 170(1)-(N), storage devices 190(1)-(M), intelligent storage array 195, or any combination thereof. All or a portion of one or more of the example embodiments disclosed herein may also be encoded as a computer program, stored in server 141, run by server 145, and distributed to client systems 151, 152 and 153 over network 150.

User Control of Automated Test Features with Software Application Programming Interface (API)

In a conventional testing environment, the test development environment may comprise an application programming interface (API) that controls many of the high level functionalities and features of the tester. The API interfaces with a control server for directing high level functionality and features of the testing platform. One typical issue with such an API is that in order to customize the testing system for a given application or a given customer, the API must be manually altered and reprogrammed. This can be a difficult, long, costly, complex and error prone process involving highly trained and specialized professionals.

Embodiments of the present invention advantageously provide an easier, faster, more automatic and streamlined way to customize the functionality and features of the API for a particular customer's needs.

In an embodiment, the test development environment includes a control server coupled to a plurality of primitives. The primitives include the tester circuitry required to apply a test plan to a plurality of DUTs. The DUTs that are tested by a given primitive are coupled to the primitive using a DIB, which contains the DUTs. The API interfaces with the control server for directing high level functionality and features of the testing platform which includes, among other features, receiving test results output from the tester and storing the data into a floor control module which may archive the data within a customer database for future reference In an embodiment, the present invention comprises a customizable API, e.g., the Customer Integrated Manufacturing Process (CIM) that is developed in such a way as to provide default behavior, but also accept user code and user APIs which are stored in a special user library. The user code and user APIs are written in such a way that they can be automatically integrated within the CIM and thereby alter the CIM's operation and functionality and features to customize the CIM to a customer's particular manufacturing processes, GUI display requirements, and DUTs. Since the CIM is developed in such a way as to be automatically altered by the user code and user APIs supplied by the customer, the CIM is much easier to customize, less error prone to modifications and can be customized in much less time and cost. This increases testing throughput for the customer and reduces test software costs at the same time.

Figure 2A:
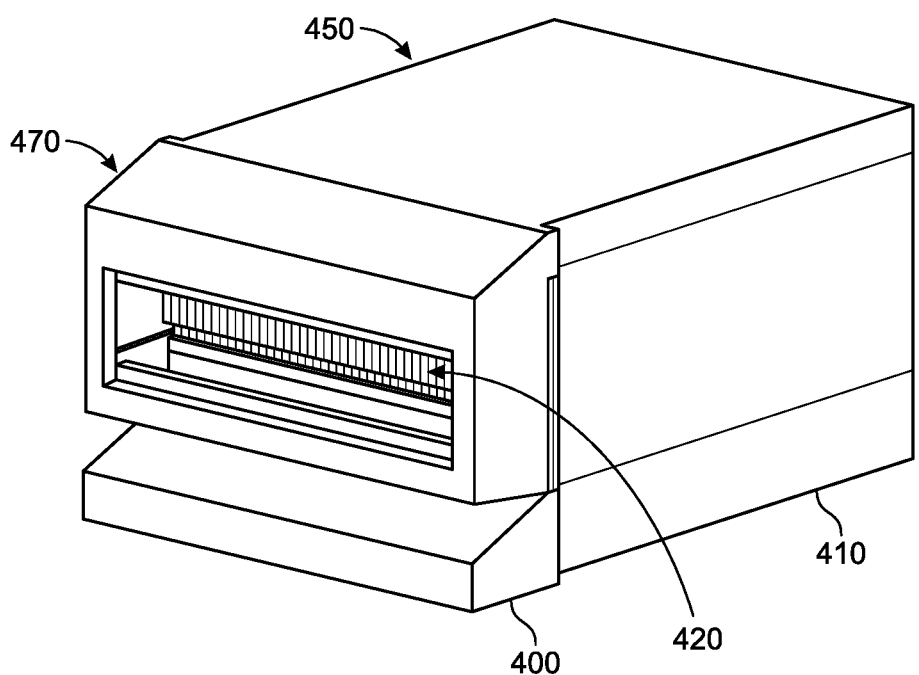
FIG. 2A illustrates a primitive interfaced with a DUT Interface Board (DIB) in accordance with an embodiment of the invention.

FIG. 2A illustrates a primitive 410 interfaced with a DUT Interface Board (DIB) 400 in accordance with an embodiment of the invention. The primitive shown in FIG. 2A is a type of discrete test module that can be inserted into a test head and comprises the test circuitry, which performs tests on the DUTs in accordance with a test plan. A primitive comprises an enclosure 450 within which all the various electronics e.g., site modules, power supplies, etc. are housed. The DIB 400 can contain a plurality of DUTs 420 using custom connectors sized for the DUTs 420. The DIB 400 can also comprise an enclosure 470. The DIB 400 interfaces to a universal backplane (not shown) of the primitive 410 through a load board (not shown). The primitive 410 contains test circuitry for performing a test plan on the DUTs 420. The primitive 410 can operate independently of any other primitive and is connected to a control server.

Figure 2B:
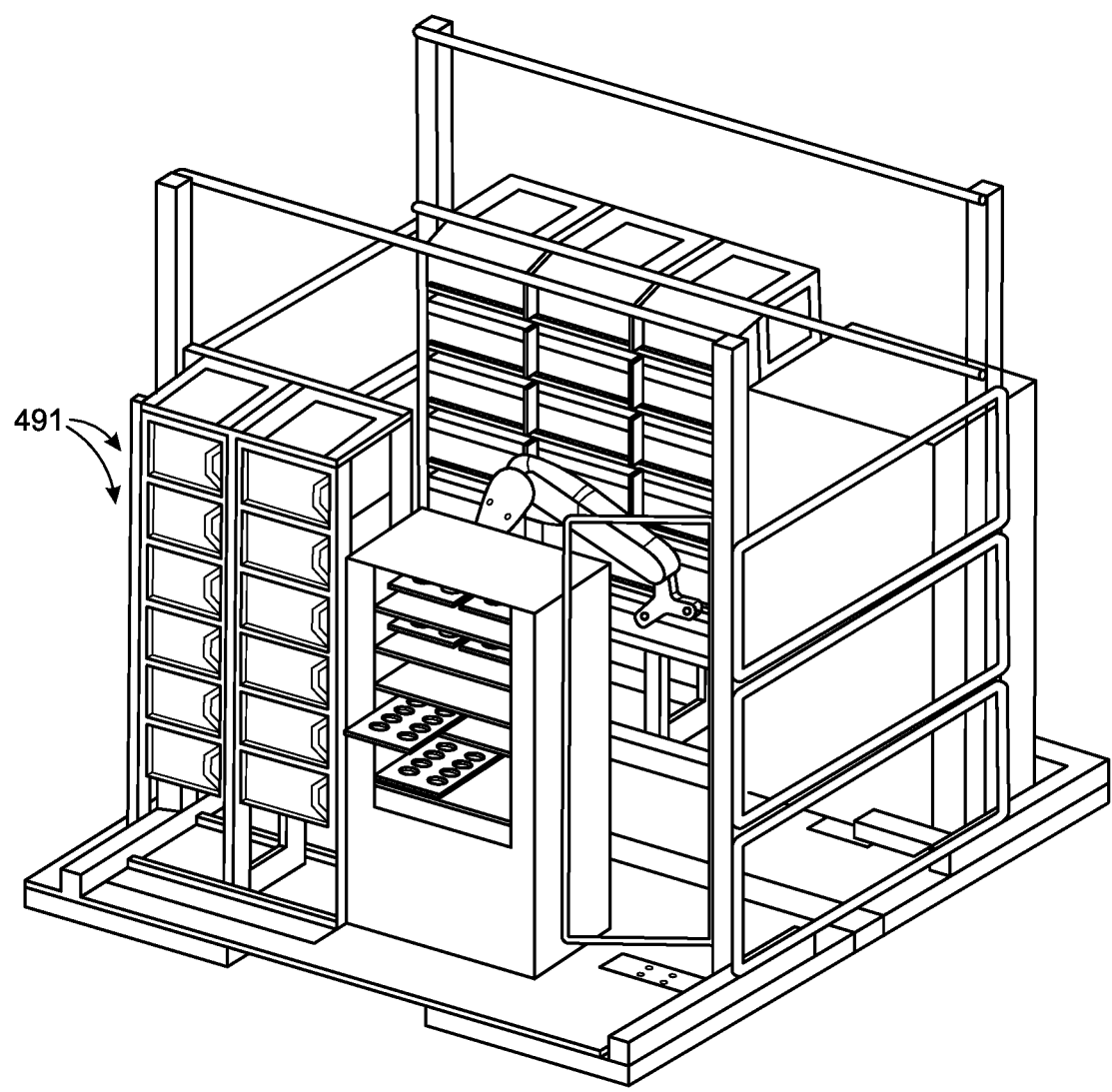
FIG. 2B illustrates a work-cell comprising a plurality of primitives maintained in racks.

FIG. 2B illustrates a work-cell comprising a plurality of primitives 491 maintained in racks. Embodiments of the present invention utilize a plurality of primitives (similar to the primitive shown in FIG. 2A) and associated DIBs to test the DUTs. Each primitive is modular meaning that it is capable of operating independently from other primitives. Therefore, a plurality of primitives set in a rack (as shown in FIG. 2B) can each be operating under a different test plan. The primitives communicate with a control server for instructions, control, management, etc. The control server is capable of hosting multiple application programs or test plans for the various primitives it supports. The primitive can communicate with the server via a standard IP network. Various computer systems, which can be located remotely, can access the server via standard IP network connections.

Therefore, under this testing platform, due to: 1) primitive modularity; and 2) use of standard IP network connections, it is possible for a plurality of primitives to be testing a plurality of DUTs under a given test plan in accordance with one user while a second plurality of primitives of the same rack are performing a completely different application (or different test plan) directed by a second user, and so on. For example, in a test head comprising 6 primitives, it may be possible for 2 of the primitives to be dedicated to an engineering department for debugging SATA type devices while 4 of the primitives may be dedicated for volume testing of SSD drives by a manufacturing department.

Figure 3:
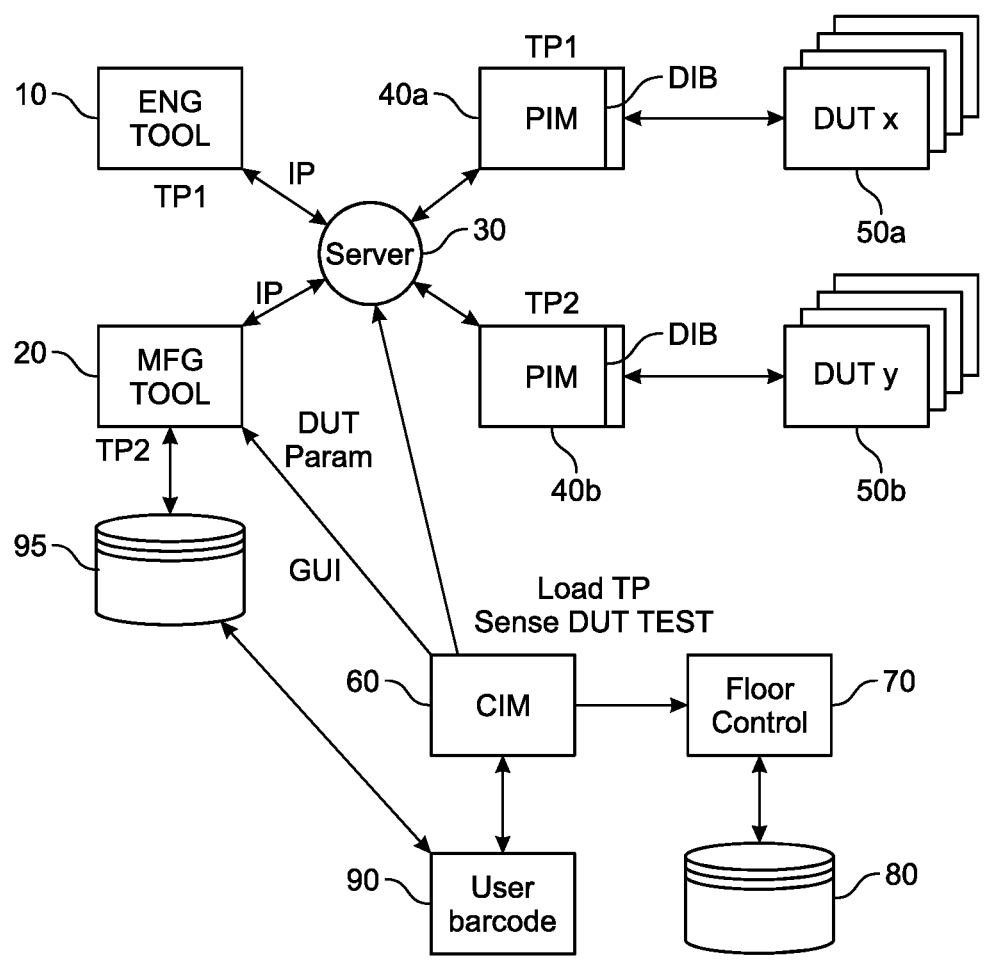
FIG. 3 is a block diagram illustrating an exemplary system environment in which the CIM operates in accordance with embodiments of the present invention.

FIG. 3 is a block diagram illustrating an exemplary system environment in which the CIM operates in accordance with embodiments of the present invention. System 300 includes a control server 30 that is coupled to a plurality of user stations 10 and 20. The user stations are connected to control server 30 via standard IP communication networks. In this example, one user station 10 is an engineering tool performing engineering tests and the user station 20 is a manufacturing tool controlling DUT testing. User station 10 controls primitive 40a through server 30 and primitive 40a is shown running test plan TP1 on DUTs 50a. User station 20 controls primitive 40b through server 30 and primitive 40b is shown running test plan TP2 on DUTs 50b.

The two primitives, 40a and 40b, can be located within a single rack (as shown in FIG. 2B). Primitive 40a is shown testing a plurality of DUTs 50a (via a DIB) using a test plan "TP1." Primitive 40b is shown testing a plurality of DUTs 50b (via a DIB) using a separate application, called test plan "TP2." Over two different standard IP network connections, a first user computer 10 and a second user computer 20 are both connected to the control server 30.

For example, a first user computer could be dedicated to the engineering department of a customer while a second user computer could be dedicated to the manufacturing department, as shown in FIG. 3. In one example, these user computers can be remote from one another and can be remote from the server 30. It is appreciated that many more primitives can be in communication with the server 30 and only two are shown for illustration. Further, other test equipment such as barcode scanners may also be connected to the server 30 and may be accessible using manufacturing tool 20 and the CIM 60.

In the example shown in FIG. 3, the second user computer 20 is controlling a manufacturing test plan on the plurality of DUTs 50b via execution by primitive 40b. This manufacturing test plan can be loaded to the control server 30 and then downloaded to the primitive 40b for execution on the DUTs 50b. Testing results can then be communicated in the opposite direction. In this example, the user computer 20 can be under control of a production specialist during volume manufacturing testing of DUTs 50b.

In this way, embodiments of the present invention can support completely different functionalities using the same tester. For example, during manufacturing testing, the tester may be running a fixed workflow using a subset of the primitives within the tester. By way of example, a manufacturing workflow may comprise bar-coding SSD drives, testing them, and tagging them as "Pass" or "Fail." At the same time, a member of the engineering team could be performing an entirely different function such as debugging fail results for SATA drives using a different set of primitives within the test head.

Coincidentally with the above testing, the first user computer 10 can control an engineering test plan for application to the plurality of DUTs 50a via primitive 40a. The engineering test plan can be a test plan under development that has not yet been finalized. Alternatively, the engineering test plan can merely be a different type of manufacturing test plan for testing different DUTs using different protocols, e.g., DUT type x versus DUT type y. This engineering test plan can be loaded to the control server 30 and then downloaded to the primitive 40a for execution on the DUTs 50a. Testing results can then be communicated in the opposite direction. In this example, the user computer 10 can be under control of a test engineer developing a test plan that is currently under prototype for future use.

In one embodiment, user computers 10 and 20 can, in one embodiment, be system controllers running testing software, e.g., Advantest SLATE™ or Advantest Stylus™. In a different embodiment, user computers 10 and 20 can be user terminals connected through a communication network, e.g., IP network to server 30, wherein server 30 is a system controller running the testing software, e.g., Advantest Stylus™.

In one embodiment, the server 30 is a controller that monitors testing for all the connected primitives and also provides a GUI to the user. In other embodiments, the user connects to the server through IP connections as shown in FIG. 3, wherein each of the user computers connected to the server provides a separate GUI to an associated user to control the associated set of primitives.

The server 30, in one embodiment, can execute an allocation scheme that allocates the resources between the users. For example, the server can allocate primitives to a user depending on the user's application. In one embodiment, the server can dynamically allocate and manage different primitives for different purposes to different users. The server also allows for bi-directional communication between each of the user computers and the various primitives (and their associated DUTs) connected to the server 30. The server can also manage the simultaneous workflows executing on the various connected primitives and track the various workflows on the connected primitives and/or tester slices.

Importantly, CIM 60 controls the high-level functionality and features of the system 100. For instance, CIM 60 controls the loading of the test plans to server 30. The CIM 60 can register, during testing, when a new DUT is inserted in a primitive and can recognize the DUT based on identification information associated with the DUT. The CIM 60 receives information regarding the loading of a new DUT, for example, from the server 30, which receives the information from a connected primitive. The CIM provides various DUT parameters to the user stations and/or the control server 30. This enables the CIM to optionally provide special DUT testing parameters to the control server 30.

The CIM can also provide customized GUI display information to the Manufacturing Tool 20. The CIM can initiate test plan execution and also receives results from the execution of the test plans on the various DUTs. The CIM can perform binning and logging functionality with respect to test results. The CIM can associate test result data with the relevant DUTs and report this information to a customer or process-specific floor control module 70 which can archive the data to a database, e.g., a customer database 80 for later reference, on a per DUT basis. The CIM also controls whether or not the testing information is encrypted and the type of encryption that is to be used for a particular customer's test. The CIM can also control the graphical user interface that is displayed on the user stations 10 and 20 during a test associated with the station.

In one embodiment, the CIM is an API that can run on server 30. In another embodiment, the CIM can run on a different controller (or computer).

In short, the CIM 60 can control many high level functions and features of the test system 100 with respect to 1) which test plans are used, 2) how the user interfaces look and operate with the tester via the user station, 3) processing when new DUTs are inserted for testing and controlling the subsequent process 4) how the test results of the testing are gathered and stored, etc. In order to communicate with the primitives or the DUTs the CIM has to go through server 30. For example, in order to run a test or read a DUT status, the CIM would have to use the server 30 as an intermediary.

In accordance with aspects of the present invention, the user can store user code and use APIs within library 90 associated with system 100. The user code can be customer developed based on information and syntax provided by the CIM developer, e.g., Advantest Corp. and then loaded into library 90. The CIM 60 then integrates the user code and user APIs so that it automatically becomes customized to a particular customer's needs and adopts specific functionality and features in accordance with the contents of the user library 90. In this way, the invention effectively provides an automatic mechanism for customizing the CIM 60, which obviates the need for the CIM 60 to be manually rewritten and redesigned for each customer's needs. This increases the turn around time for developing a new CIM, and also decreases the overall software costs and errors caused by CIM modifications.

Advantages of embodiments of the invention include a more streamlined, automated and easier mechanism for customizing a CIM to a particular customer's testing needs and required features. This leads to faster testing throughput and reduced costs and complexity with respect to volume testing of the DUTs. Other advantageous include that highly trained programming specialists and designers are not necessarily required to customize a CIM.

In conventional tester systems, the API controlling many of the high level functionalities and features of the tester needed to be manually rewritten and redesigned for each customer's needs, as noted above. The API e.g., CIM, of the embodiments of the present invention obviates the need for this by providing a standardized production flow for each customer that the customer can then customize, in either minor or significant ways, to suit their own purposes. For example, most customers have similar requirements for various parameters within the production flow, e.g., how and where the test program needs to be loaded, where the test program starts, the kinds of warning to output in case of error, the type of indicator light to show the user where to insert a DUT, etc. However, certain customers may want to make either minor or significant changes to the default behavior of the production flow.

Embodiments of the present invention take advantage of the similar process requirements for most customers by providing a standardized interface (e.g., the CIM) that can be customized to fit the needs of individual customers. This replaces the laborious and painstaking process of developing a special API for each customer based on their needs. It allows each user to have a proprietary configuration of the default production flow without expending the resources towards developing a new API or code for a proprietary production flow.

The CIM provides default behavior for all customers, but advantageously also accepts user code and user APIs, which are stored in a special user library. In other words, the default production flow accesses its own set of pre-programmed user libraries. However, the default production flow of the CIM can be customized by individual users to access special user-provided libraries that may configure the production flow differently from the default behavior. The CIM, therefore, provides a framework that allows for some routine customizations by the user and also allows fully user defined functions.

The default framework provided by the CIM comprises a default production flow that may be application to all customers. Any customer having special requirements, however, may customize the default production flow to add, edit, or delete steps unique to their own production flow.

As mentioned above, the user code and user APIs are written in such a way that they can be automatically integrated within the CIM and thereby alter the CIM's operation and functionality and features to customize the CIM to a customer's particular manufacturing processes, GUI display requirements, and DUTs. Since the CIM is developed in such a way as to be automatically altered by the user code and user APIs supplied by the customer, the CIM is much easier to customize, less error prone to modifications and can be customized in much less time and cost.

For example, a customer at user station 20 (which is the manufacturing tool) may use the API (e.g., the CIM) to configure the manner in which testing takes place in their production flow. The default production flow in the CIM may be configured to display a red LED on the testing system when the user inserts a DUT into a primitive. If a customer wants to customize the CIM to change it to a blinking light, the customer can easily customize the CIM with an API or user code that alters the CIM to display a blinking light instead. This makes it easier for a new customer to integrate their production flow with the default CIM. Accordingly, embodiments of the present invention advantageously circumvent the painstaking process of new customers needing to develop their own user code and APIs to handle their production flow.

In one example, a customer may need to control the behavior of the fans in the primitives 40a or 40b. When the server 30 starts, the fans will typically be set to a default speed and default temperature control. Embodiments of the present invention allow the user to change the default fan speed and temperature control routine that may be part of the default behavior of the production flow to a different speed. The user may, for example, may be able to change the fan speed using the GUI on the manufacturing tool 20 (using the SLATE™ interface which will be discussed further below). The user may be able to customize the CIM and integrate the new fan speed and temperature control into a customized CIM. For example, a user may be able to make the fan speed dependent on an event, e.g., the fans might be turned high when the test starts and turned low when the test ends.

In another example, a new customer may want to use the default production flow that is part of the CIM, however, they may need to employ certain security measures for confidential data that they may not want exposed at the default CIM level. As mentioned above, the CIM also controls whether or not the testing information is encrypted and the type of encryption that is to be used for a particular customer's test. The new customer may be able to customize the CIM to use a particular type of encryption that is specific to the customer. In other words, the new customer may be able to alter the default behavior of the CIM to access user-specified libraries (stored in library 90) that replace the default encryption behavior with the customer-specific encryption scheme. Embodiments of the present invention, therefore, allow the customer to customize the CIM so that their test data remains encrypted using a user-specified encryption technique.

In a different example, a new customer may want to change the default information that is exchanged between the manufacturing tool 20 and the primitive 40b during set up. For example, a customer may need some additional information regarding the primitive 40b during set-up that is not part of the original production flow. Embodiments of the present invention advantageously allow the customer to alter the default production flow with user-specified libraries (stored within library 90) to obtain the additional information from primitive 40b. The CIM 60 integrates the user code and user APIs stored in library 90 so that it automatically becomes customized to a particular customer's needs and adopts specific functionality and features in accordance with the contents of the user library 90.

As mentioned previously, the CIM can also associate test result data with the relevant DUTs and report this information to a customer or process-specific floor control module 70 which can archive the data to a customer database 80 for later reference, on a per DUT basis. By way of example, the customer may have proprietary information or processes that are part of the floor control module 70. The customer may want to alter the default production flow to acquire more information from the DUTs while they are being tested. The customer would amend the default production flow using the manufacturing tool 20 (that allows access to the CIM library 60) to more closely manage the exchange of data between DUT 50b and the floor control module 70. Further, the customer may be able to manage individual DUT processing, thereby, allowing the customer more control over the testing and processing of each DUT. For example, the customer may modify the CIM to run a specific test program on the DUT and within the test program, they may want a specific test flow to execute on the DUT and provide the results of the test back to the floor control module 70. The customer modification to the default production flow may also comprise making decisions based on the results of the testing process. The CIM also allows customer to program decision-making steps into their modifications to the default production flow.

The CIM may also allow for more control over the processing that takes place when new DUTs are inserted for testing and any subsequent processing. Further, the CIM may allow modifications of the manner in which the test results of the testing are gathered and stored. The customer may also choose to encrypt this data to protect the proprietary information that is part of the floor control module 70.

The manufacturing tool 20 will typically comprise the default service provider software, e.g., the SLATE™ interface (part of the Advantest Stylus™ software package) for the MPT3000HVM product, which is optimized for asynchronous single-DUT testing in a high-volume production environment. The manufacturing tool 20 will also comprise ancillary customer-specific APIs or processes that have been configured by a customer and are proprietary to the customer. The CIM provides the bridge between the service provider software that comprises the default production flow and the customer-specific API and processes that are also running on the manufacturing tool 20. In other words, the CIM allows the software running the default production flow to integrate with the customer-specific customizations on the manufacturing tool 20.

The CIM can also provide customized GUI display information to the Manufacturing Tool 20. In other words, the customer may customize the CIM to change the manner in which the GUI of the default service provider, e.g., the SLATE™ interface software appears. The customer may be able to customize the GUI with their specific production flows and any relevant messages or orders for a user specific to the customer. In other words, the CIM allows modifications to the manner in which the user interfaces look and operate with the tester via the user station 20. The customization of the GUI is again possible as a result of the CIM that allows user-specific customizations to be integrated with the default service provider software.

Figure 4:
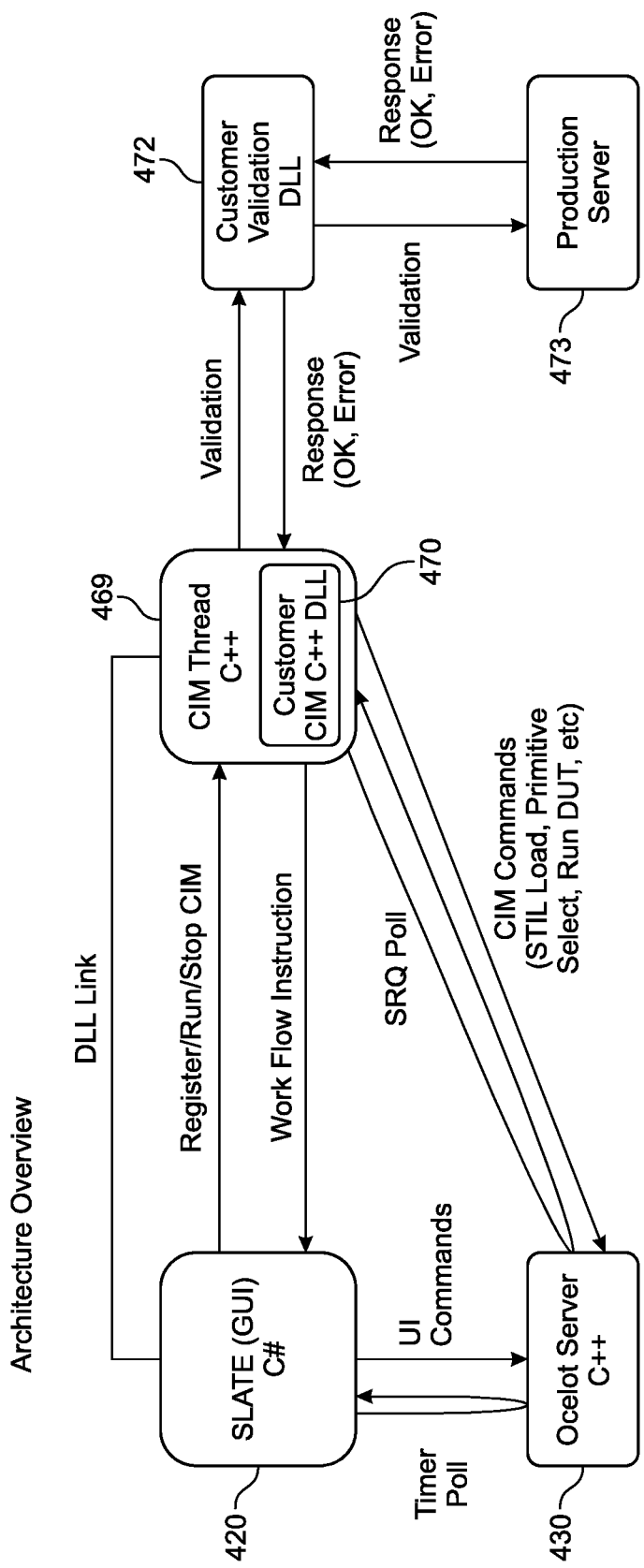
FIG. 4 illustrates another high-level architectural overview of an exemplary test environment within which the CIM operates in accordance with embodiments of the present invention.

FIG. 4 illustrates another high-level architectural overview of an exemplary test environment within which the CIM operates in accordance with embodiments of the present invention.

As shown in FIG. 4, the user interacts with the GUI 420 of the tester software, e.g., SLATE™. For example, the manufacturing tool 20 of FIG. 3 may run the tester software with GUI 420. The manufacturing tool 20 uses the tester software, e.g., SLATE™ to provide customizations to the customer and is also able to access basic tester resources and processes through server 430 (corresponding to server 30 of FIG. 3). The user may input commands to register, run or stop the CIM 469 from the GUI 420. As noted above, the CIM 469 can provide customized GUI display information to GUI 420 using work-flow instructions.

Further, the manufacturing tool 20 using the GUI can send UI commands to the server 430. The manufacturing tool 20 is able to access basic tester resources, e.g., primitives, and processes using server 430.

A customer may modify the CIM shown in FIG. 4 as customer CIM Dynamic-Link Library (DLL) 470. The customer generated code or API can be customer developed based on information and syntax provided by the CIM developer and then loaded into library 90 (as seen in FIG. 3). The CIM 469 then integrates the user code and user APIs so that it automatically becomes customized to a particular customer's needs and adopts specific functionality and features in accordance with the contents of the user library 90. The customer modification generates a validation DLL 472, which is validated by production server 473. In an embodiment, library 90 corresponds with DLL 472.

As noted above, the CIM 469 controls the loading of the test plans to server 430. The CIM 469 can register, during testing, when a new DUT is inserted in a primitive and can recognize the DUT based on identification information associated with the DUT. The CIM 469 receives information regarding the loading of a new DUT, for example, from the server 430, which receives the information from a connected primitive. The CIM provides various DUT parameters to the user stations and/or the control server 430. This enables the CIM to optionally provide special DUT testing parameters to the control server 430. The CIM can also send commands to the server 30 to select a particular primitive or to run a particular DUT. Test flows on a DUT can be started either from the GUI 420 or from CIM 469, but the compilation of the flow of information to the primitive always takes place using the server 430.

The customer can make modifications to the default production flow to customize any of these features using customer-specific code and integrate them into CIM 469 using customer CIM DLL 470. While the server 430 provides some functionality to access and utilize tester resources, e.g., primitives, the CIM allows for customizations to take place that can use the default functionality of the server 430 in different ways or execute different test flows in addition to or in place of the default production flow.

Figure 5:
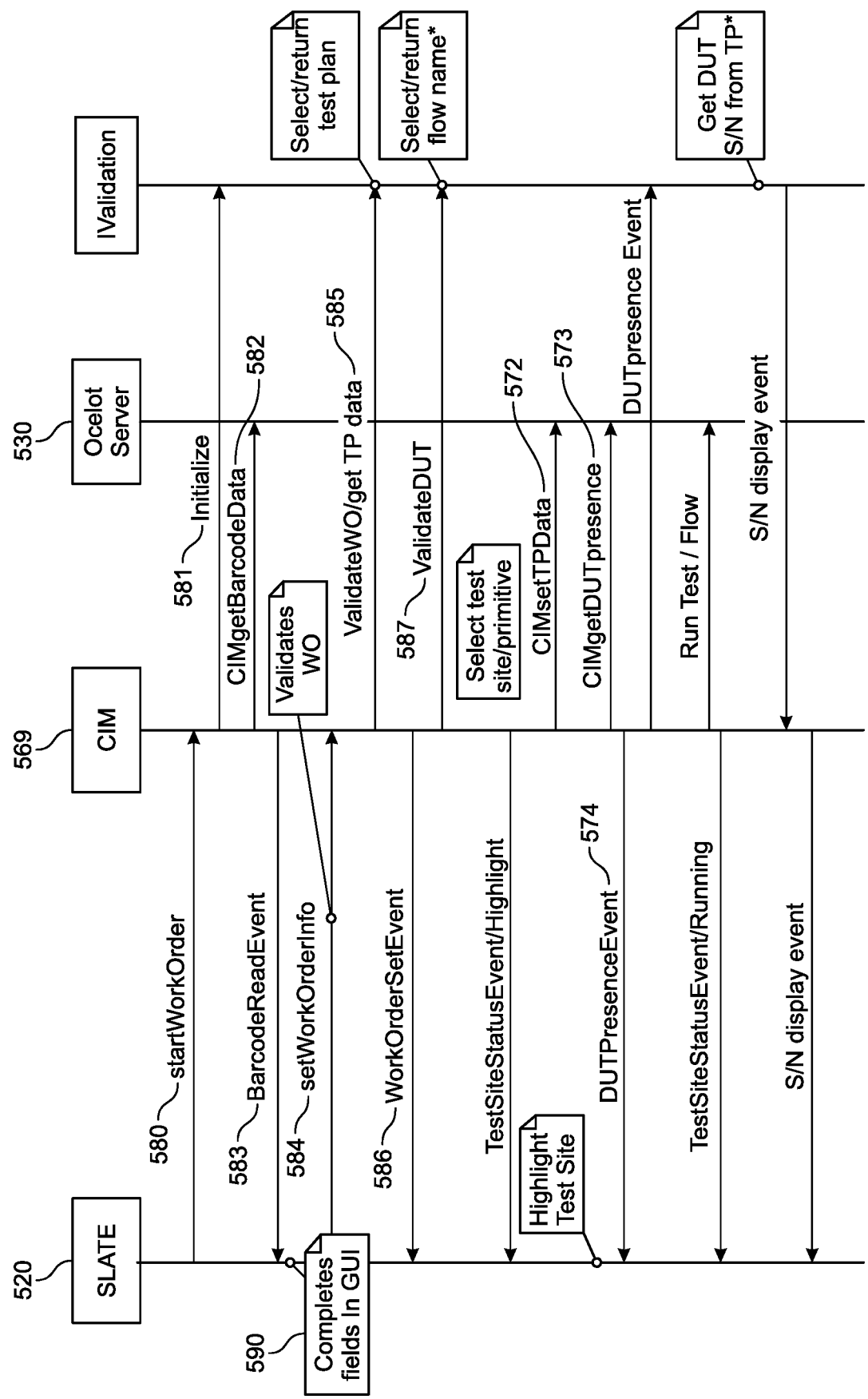
FIG. 5 illustrates an exemplary work order sequence for a customer that has modified the default production flow of a CIM in accordance with embodiments of the present invention.

FIG. 5 illustrates an exemplary work order sequence for a customer that has modified the default production flow of a CIM in accordance with embodiments of the present invention. The work order sequence of FIG. 5 illustrates some exemplary modifications a customer can make to a CIM 569 to suit the needs of their unique testing process. For example, the customer may modify the GUI at manufacturing tool 520 (comprising the SLATE™ software) with a button that starts a particular work order shown by sequence "startWorkOrder" 580. When the customer initiates a particular work order by pushing the appropriate button in the GUI, the CIM gets alerted, which in turn reports the starting of the work order to the customer interface (e.g., floor control module 70 in FIG. 3). This is shown in FIG. 5 as the "Initialize" sequence 581.

In the example of FIG. 5, the customer may modify the CIM to scan the serial number and barcode data of every incoming box on the production floor that contains DUTs. This may be to alert the customer regarding whether the work order is associated with a single or several barcode numbers. The barcode scanner in this example may be connected to the server 530. The modified CIM communicates with the server 530 to obtain the barcode data during sequence 582 and, subsequently, the CIM is further modified to report the barcode data back to the GUI during sequence 583.

Similarly, sequence 584 is a modification by the customer to set work order information. The customer may be allowed to enter in some information regarding the work order by modifying the GUI in between sequences 583 and 584. The work order information is set and validated during sequence 584. The CIM then gets the test plan data for the validated work order during sequence 585. (Also, with sequence 585, the user can also specify a thermal algorithm and thermal setpoint if the user has opted to use a ThermalControl DLL.) The CIM may have the customer enter the test plan through, for example, floor control module 70 (as shown in FIG. 3). The work order is set and reported to the GUI during sequence 586. The DUT to be tested is validated by the CIM during sequence 587 and the test flow name to be run on the DUT is obtained from the floor control module 70.

Similarly, each sequence shown in FIG. 5 is an example of a modification created by a customer to the default production flow of a CIM. For example, sequence 572 comprises the CIM 469 communicating with the server 430 to set the test plan data, sequence 573 comprises the CIM 469 communicating with the server 430 to establish connection with the DUT, and sequence 574 comprises the CIM 469 reporting the event to the GUI.

Figure 6:
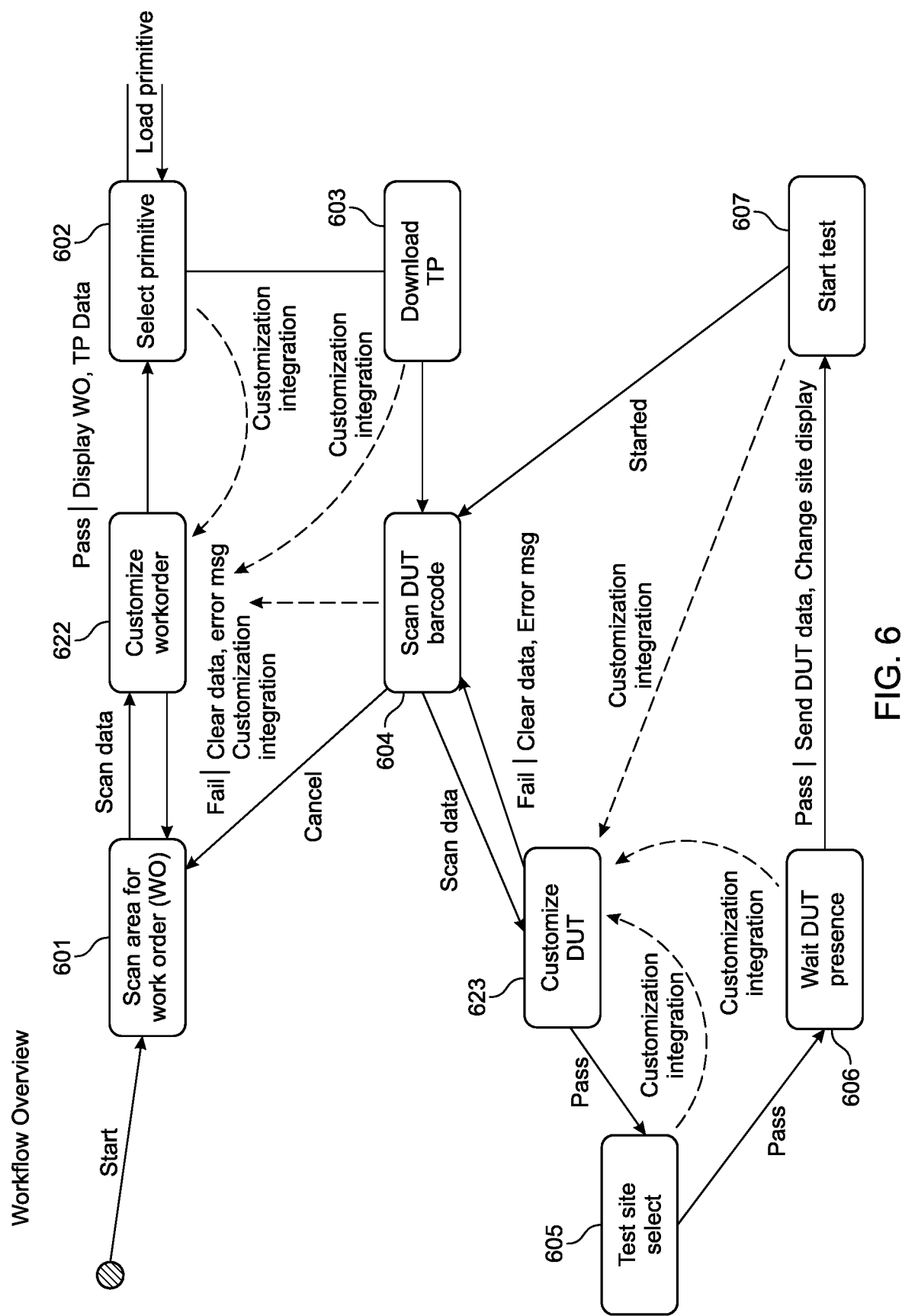
FIG. 6 illustrates an exemplary state diagram illustrating the manner in which a customer may modify the default production flow of a CIM in accordance with embodiments of the present invention.

FIG. 6 illustrates an exemplary state diagram illustrating the manner in which a customer may modify the default production flow of a CIM in accordance with embodiments of the present invention. FIG. 6 illustrates a default production flow for a customer, wherein the customer is allowed certain customizations to the production flow in certain states. For example, as will be discussed further below, states 622 (Customize Workorder) and state 623 (Customize DUTs) provide integration points for the customer, where modifications to the CIM enable customization of the standard production flow offered by the default CIM. In other words, states 622 and 623 are entry-point states for the customer to enter the production workflow and customize it based on their particular needs.

Accordingly, any customer modification made at any of the other states will need to go through states 622 or 623. For example, if the user wanted to modify some procedure related to downloading the test plan at state 603, the customization integration process would link the user back to state 622. Similarly, if the user wanted to modify some procedure related to the selecting of a test site (e.g. selection of a primitive), the user would need to link back to state 623.

After the work order is prepared and processed, there are no more events that relate to work order, instead, the CIM starts processing events that relate to a specific DUT. Accordingly, state 622 addresses any modifications related to work order processing and state 623 addresses any modifications related to DUT processing. States 622 and 623 are the major points of integration for a customer modifying the CIM where work order processing and DUT processing, respectively, is performed. However, the other states also provide interception points that allow the user to return to the customization integration states (e.g. 622 and 623) to perform additional configuring.

In state 601, data is scanned for the work orders, e.g., barcodes, serial numbers of DUTs, etc. and the work order is prepared. (State 601 may roughly correspond with sequences 580-584 in FIG. 5). For example, the work order may comprise scanning and testing the part number associated with a bucket of SATA disk drives. The scanned data is passed along to the next state, Customize Workorder 622. As stated above, state 622 (Customize WorkOrder), allows modification related to the work order processing by the customer. Subsequent to the customization, at state 602, the primitive comprising the DUT to be tested is selected (or loaded). At this point if a customer needs to make some modification to the primitive set up, the CIM allows the customer an interception point to return to state 622 to perform this customization.

At state 603, the test program that was indicated by the user during state 622 is downloaded to the primitive. Similarly to state 602, the customer is also provided an interception point here to make any modifications. At state 604, the DUT barcode is scanned and the user has the option of making customizations to this process by returning to state 622. At each stage of setting up and processing the work order, the user can make customizations by returning to state 622.

Once the work order is processed, then the individual DUT testing customization begins following state 604, after the DUT barcode is scanned. If the DUT barcode is successfully scanned at state 604, the production flow proceeds to state 623, otherwise, it loops back to state 604 if an incorrect device is scanned or the scan failed. For example, the user may scan a device that may not be part of an initial work order and may have been incorrectly placed in the tray of devices that are supposed to be tested as part of the work order. In other words, the device may have a serial number that does not correlate with the part number for the bucket that was scanned during state 601. In this case, an error message would be displayed to the user on the GUI and the production flow would return to state 604.

In state 623, the user can make customizations related to the DUT processing. At state 605, the selection of the test site, e.g., primitive selection takes place. Test site selection may provide customers with an opportunity to customize the test site selection, e.g., the customer may want to display a certain colored light when the tester is ready to load the DUT. Again, to perform customizations, state 605 provides an interception point back to state 623.

At state 606, the DUT is detected. The customer may need to make certain customizations related to DUT detection, e.g., the customer may want a GUI message to alert the user that the DUT has been detected. Again, to perform customizations, state 606 provides an interception point back to state 623. Once the DUT is detected, the DUT data is transmitted to the server 430 and the GUI 420 and the site display is changed at the GUI in accordance with the DUT data. Finally, at state 607, the DUT can be tested.

Figure 7:
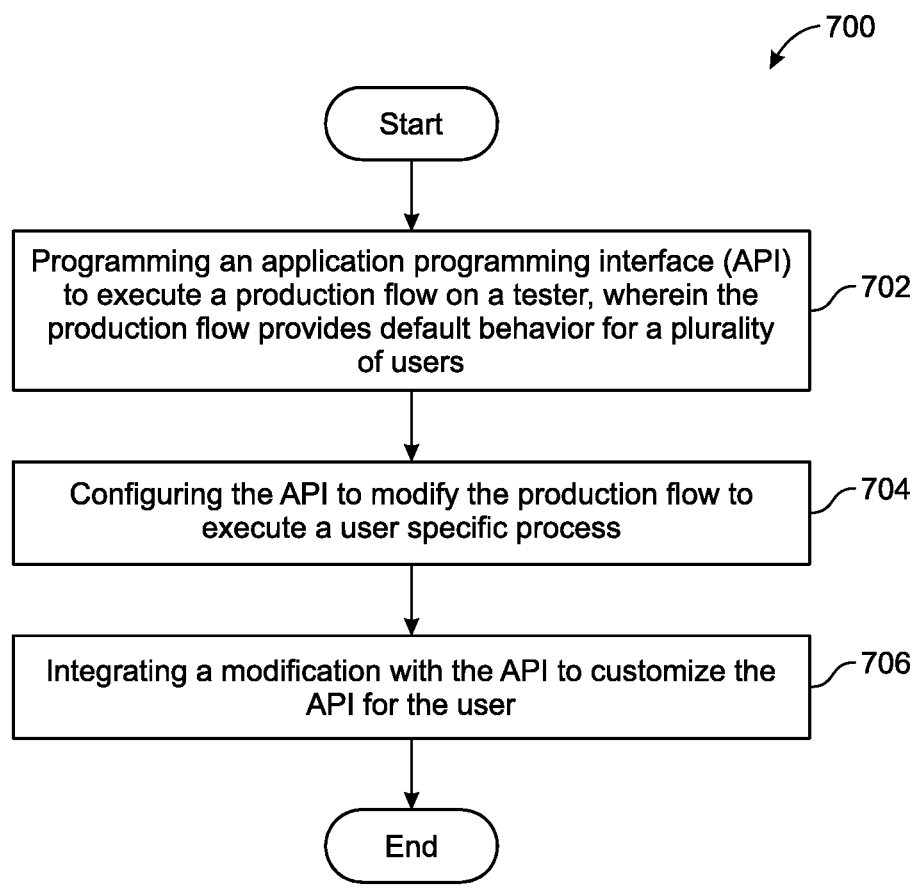
FIG. 7 illustrates a flowchart of an exemplary computer implemented process for modifying an application programming interface (API) for controlling a tester in accordance with embodiments of the present invention.

FIG. 7 illustrates a flowchart of an exemplary computer implemented process for modifying an application programming interface (API) for controlling a tester in accordance with embodiments of the present invention.

At step 702, an application programming interface, e.g., the CIM is programmed to execute a production flow on a tester. In short, the CIM 60 can control many high level functions and features of the test system 100 with respect to 1) which test plans are used, 2) how the user interfaces look and operate with the tester via the user station, 3) processing when new DUTs are inserted for testing and controlling the subsequent processes, 4) how the test results of the testing are gathered and stored, etc.

As mentioned earlier, the CIM 60 controls the high level functionality and features of the system 300. For instance, in an embodiment, the CIM 60 controls the loading of the test plans to server 30. In another embodiment, the CIM 60 can sense, during testing, when a new DUT is inserted in a primitive and can recognize the DUT based on identification information associated with the DUT. In yet another embodiment, the CIM provides various DUT parameters to the user stations and/or the control server 30. This enables the CIM to optionally provide special DUT testing parameters to the control server 30.

In one embodiment, the CIM can also provide customized GUI display information to the Manufacturing Tool 20. Further, in an embodiment, the CIM can initiate test plan execution and also receives results from the execution of the test plans on the various DUTs. Additionally, in an embodiment, the CIM can perform binning and logging functionality with respect to test results. In a different embodiment, the CIM can associate test result data with the relevant DUTs and report this information to a customer or process-specific floor control module 70 which can archive the data to a customer database 80 for later reference, on a per DUT basis.

At step 704, the CIM can be configured to modify the production flow to execute a user specific process. In accordance with aspects of the present invention, the user can store user code and use APIs within library 90 associated with system 100. The user code can be customer developed based on information and syntax provided by the CIM developer and then loaded into library 90.

Finally, at step 706, the modification is integrated with the CIM to provide an API that is customized to the specific user. The CIM 60 integrates the user code and user APIs so that it automatically becomes customized to a particular customer's needs and adopts specific functionality and features in accordance with the contents of the user library 90. In this way, embodiments of the invention effectively provide an automatic mechanism for customizing the CIM 60, which obviates the need for the CIM 60 to be manually rewritten and redesigned for each customer's needs.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method for performing tests using automated test equipment (ATE), said method comprising:
    programming an application programming interface (API) to control a default production flow on a tester, wherein the production flow comprises a plurality of test sequences associated with executing tests on devices under test (DUTs) connected to the tester;
    configuring the API to modify the default production flow to customize the plurality of test sequences in accordance with a user-specific API, wherein the user-specific API comprises a modification to the default production flow in accordance with testing requirements of a user, wherein the user-specific API, comprising user-specific computer code, is operable to be stored in a user library that is communicatively coupled with the API, and wherein the modification to the production flow comprises collecting additional test data from the DUTs during testing specific to the user; and
    integrating the user-specific API with the API to customize the API for a testing process particular to the user, wherein the integrating comprises incorporating features defined in the user library for the user-specific API into the API and altering the API using the user-specific computer code,
    wherein the plurality of test sequences are operable to be customized in accordance with the user-specific API to encrypt information using a user-specific encryption scheme related to the executing of tests on the DUTs.

2. The method of claim 1, wherein the API is communicatively coupled to a server and a computing device executing a graphical user interface, and controls the production flow through the server and graphical user interface.

3. The method of claim 1, wherein the additional test data is reported to the user at a user-specified floor control module, wherein the floor control module comprises a server on a production floor of a user, wherein the floor control module is communicatively coupled with a database operable to archive the additional data.

4. The method of claim 3, wherein the floor control module comprises proprietary information related to the user and to the executing of the tests on the DUTs.

5. The method of claim 1, wherein the plurality of test sequences are operable to be customized in accordance with the user-specific API to perform actions selected from the group consisting of: loading a test plan to a server, recognizing a DUT inserted into a primitive based on identification information associated with the DUT, provide DUT parameters to user stations and the server, provide customized GUI display to a user, initiate test plan execution, receive results executing of the test plan on a DUT and performing binning and logging of test results.

6. A non-transitory computer-readable medium having computer-readable program code embodied therein for causing a computer system to perform a method for performing tests using automated test equipment (ATE), the method comprising:
    programming an application programming interface (API) to control a default production flow on a tester, wherein the production flow comprises a plurality of test sequences associated with executing tests on devices under test (DUTs) connected to the tester;
    configuring the API to modify the default production flow to customize the plurality of test sequences in accordance with a user-specific API, wherein the user-specific API comprises a modification to the default production flow in accordance with testing requirements of a user, wherein the user-specific API, comprising user-specific computer code, is operable to be stored in a user library that is communicatively coupled with the API, and wherein the modification to the production flow comprises collecting additional test data from the DUTs during testing specific to the user; and
    integrating the user-specific API with the API to customize the API for a testing process particular to the user, wherein the integrating comprises incorporating features defined in the user library for the user-specific API into the API and altering the API using the user-specific computer code,
    wherein the plurality of test sequences are operable to be customized in accordance with the user-specific API to encrypt information using a user-specific encryption scheme related to the executing of tests on the DUTs.

7. The computer-readable medium of claim 6, wherein the API is communicatively coupled to a server and a computing device executing a graphical user interface, and controls the production flow through the server and the graphical user interface.

8. The computer-readable medium of claim 6, wherein the additional test data is reported to the user at a user-specified floor control module, wherein the floor control module comprises a server on a production floor of a user, wherein the floor control module is communicatively coupled with a database operable to archive the additional data.

9. The computer-readable medium of claim 8, wherein the floor control module comprises proprietary user-related information.

10. The computer-readable medium of claim 6, wherein the plurality of test sequences are operable to be customized in accordance with the user-specific API to perform actions selected from the group consisting of: loading a test plan to a server, recognizing a DUT inserted into a primitive based on identification information associated with the DUT, provide DUT parameters to user stations and the server, provide customized GUI display to a user, initiate test plan execution, receive results executing of the test plan on a DUT and performing binning and logging of test results.

11. A system for performing tests using automated test equipment (ATE), the system comprising:
  a server communicatively coupled to a plurality of primitives, wherein each of the plurality of primitives comprises a plurality of DUTs;
  a first computing device running a graphical user interface (GUI), wherein the computing device is communicatively coupled to the server, and wherein the graphical user interface allows a user to access the plurality of primitives;
  a second computing device communicatively coupled with the server and the first computing device, and wherein the second computing device is configured to:
    program an application programming interface (API) to control a default production flow, wherein the production flow comprises a plurality of test sequences associated with executing tests the DUTs connected to the server;
    configure the API to modify the default production flow to customize the plurality of test sequences in accordance with a user-specific API, wherein the user-specific API comprises a modification to the default production flow in accordance with testing requirements of a user, wherein the user-specific API, comprising user-specific computer code, is operable to be stored in a user library that is communicatively coupled with the second computing device, and wherein the modification to the production flow comprises collecting additional test data from the DUTs during testing specific to the user; and
    integrate the user-specific API with the API to customize the API for a testing process particular to the user, wherein to integrate the user-specific API, the second computing device is further configured to incorporate features defined in the user library for the user-specific API into the API and alter the API using the user-specific computer code,
    wherein the plurality of test sequences are operable to be customized in accordance with the user-specific API to encrypt information using a user-specific encryption scheme related to the executing of tests on the DUTs.

12. The system of claim 11, the user uses the GUI to configure the API to modify the default production flow.

13. The system of claim 11, wherein the additional test data is reported to the user at a user-specified floor control module, wherein the floor control module comprises a server on a production floor of a user, wherein the floor control module is communicatively coupled with a database operable to archive the additional data.

* * * * *